(12) United States Patent
Schermer et al.

(10) Patent No.: US 9,007,597 B2
(45) Date of Patent: Apr. 14, 2015

(54) MICROWAVE PHOTONIC TRUE-TIME-DELAY

(75) Inventors: Ross Schermer, Springfield, VA (US); Frank Bucholtz, Crofton, MD (US); Carl A. Villarruel, Burke, VA (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 135 days.

(21) Appl. No.: 13/487,416

(22) Filed: Jun. 4, 2012

(65) Prior Publication Data

US 2013/0010301 A1 Jan. 10, 2013

Related U.S. Application Data

(60) Provisional application No. 61/492,855, filed on Jun. 3, 2011.

(51) Int. Cl.
*G01B 9/02* (2006.01)
*H03H 9/30* (2006.01)
*H01P 9/00* (2006.01)
*G02B 27/00* (2006.01)
*G02B 26/10* (2006.01)

(Continued)

(52) U.S. Cl.
CPC .. *H03H 9/30* (2013.01); *H01P 9/00* (2013.01); *G02B 27/0087* (2013.01); *G02B 26/105* (2013.01); *G02B 27/44* (2013.01); *H03B 17/00* (2013.01); *G02B 26/06* (2013.01); *G02B 27/4233* (2013.01)

(58) Field of Classification Search
CPC ........ G02B 26/06; G02B 26/105; H03H 9/30; H03H 9/38; H03H 9/40; H03H 9/42; H03H 9/423; H03H 9/44

USPC .................................................. 356/452.455
See application file for complete search history.

(56) References Cited

U.S. PATENT DOCUMENTS 6,317,532 B1 * 11/2001 Lin et al. .......................... 385/18
2002/0141063 A1 * 10/2002 Petrov et al. .................. 359/566

(Continued)

OTHER PUBLICATIONS

Jemison, W.D.; Herczfeld, P.R., "Acoustooptically controlled true time delays," Microwave and Guided Wave Letters, IEEE, vol. 3, No. 3, pp. 72,74, Mar. 1993.*

(Continued)

*Primary Examiner* — Tri T. Ton
*Assistant Examiner* — Willie Merrell, II
(74) *Attorney, Agent, or Firm* — US Naval Research Laboratory; Sally A. Ferrett

(57) ABSTRACT

A true time delay system and method for an optical carrier signal modulated with a microwave signal. The system includes a beam deflector, with the optical signal being imaged onto the beam deflector, a stationary reflective diffractive grating arranged in a Littrow configuration, a focusing element arranged between the beam deflector and the stationary reflective diffractive grating. In operation, the beam deflector steers the optical beam across the clear aperture of the focusing element and the focusing element transmits the steered beam to the reflective diffractive grating. A change in optical path length experienced by the optical beam as the beam is scanned across the grating surface results in a relative phase delay in the optical beam. The beam deflector can be a rotating mirror, an acousto-optic beam deflector, or an electro-optic beam deflector. The focusing element can be a lens or a curved mirror.

28 Claims, 14 Drawing Sheets

(51) Int. Cl.

| | | |
|---|---|---|
| *G02B 27/44* | (2006.01) | |
| *H03B 17/00* | (2006.01) | |
| *G02B 26/06* | (2006.01) | |
| *G02B 27/42* | (2006.01) | |

(56) References Cited

U.S. PATENT DOCUMENTS

| | | | |
|---|---|---|---|
| 2002/0176151 A1* | 11/2002 | Moon et al. | 359/298 |
| 2003/0007148 A1* | 1/2003 | Moon et al. | 356/328 |
| 2004/0233532 A1* | 11/2004 | Cussat-Blanc et al. | 359/566 |
| 2005/0099692 A1* | 5/2005 | Islam et al. | 359/573 |
| 2010/0277717 A1* | 11/2010 | Stern et al. | 356/51 |

OTHER PUBLICATIONS

Schermer, R.; Bucholtz, F.; and Villarruel, C.; "Continuously-tunable microwave photonic true-time-delay based on a fiber-coupled beam deflector and diffraction grating," Opt. Express, vol. 19, pp. 5371-5378, Mar. 14, 2011, published Mar. 7, 2011.

Schermer, R.T.; Bucholtz, F.; , "Photonic methods for RF phase shifting," 2011 IEEE Avionics, Fiber- Optics and Photonics Technology Conference (AVFOP), pp. 109-110, Oct. 4-6, 2011, doi: 10.1109/AVFOP.2011.6082151, (Oct. 2011).

Paek, E.G.; Choe, J.Y.; Oh, T.K.; , "High-resolution grating-assisted acousto-optic tunable filter," Lasers and Electro-Optics, 1998. CLEO 98. Technical Digest, Summaries of papers presented at the Conference on, pp. 398-399, May 3-8, 1998.

Liu, L.; Chen, N.G.; "Double-pass rotary mirror array for fast scanning optical delay line", Applied Optics, vol. 45, No. 21, pp. 5426-5431, Jul. 20, 2006.

Seeds, A.J. and Williams, K.J. "Microwave photonics," Journal of Lightwave Technology, vol. 24, pp. 4628-4642 (Dec. 2006).

Minasian, R.A., "Photonic signal processing of microwave signals," IEEE Transactions on Microwave Theory and Techniques, vol. 54, No. 2, pp. 832-846 (Feb. 2006).

Tucker, R.S., "The role of optics and electronics in high-capacity routers," Journal of Lightwave Technology, vol. 26, No. 12, pp. 4655-4673 (Dec. 2006).

Deng, K.-L., et al., "A 1024-channel fast tunable delay line for ultrafast all-optical TDM networks," IEEE Photonics Technology Letters, vol. 9, No. 11, pp. 1496-1498 (Nov. 1997).

Henderson, D.A., et al, "Kilohertz scanning, all-fiber optical delay line using piezoelectric actuation," Proc. SPIE, vol. 5589, pp. 99-106 (2004).

Hunter, D.B., et al, "Demonstration of a continuously variable true-time delay beamformer using a multichannel chirped fiber grating," IEEE Transactions on Microwave Theory and Techniques, vol. 54, No. 2, pp. 861-867 (Feb. 2006).

Zhou, B., et al, "Impact of group delay ripples of chirped fiber grating on optical beamforming networks," Optics Express, vol. 16, No. 4, pp. 2398-2404 (Feb. 2008).

Kaman, V., "A 32-element 8-bit photonic true-time-delay system based on a 288 × 288 3-D MEMS optical switch," IEEE Photonics Technology Letters, vol. 15, No. 6, pp. 849-851 (Jun. 2003).

Frankel, M.Y., et al, "Fiber-optic true time steering of an ultrawide-band receive array," IEEE Transactions on Microwave Theory and Techniques, vol. 45, pp. 1522-1526 (Aug. 1997).

Alic, N., et al, "Two-pump parametric optical delays," IEEE Journal of Selected Topics in Quantum Electronics, vol. 14, No. 3, pp. 681-690 (May/Jun. 2008).

Piao, D., and Zhu, Q., "Power-efficient grating-based scanning optical delay line: time-domain configuration," Electronics Letters, vol. 40, pp. 97-98 (2004).

Jiang, Z., Zhu, Q., and Piao, D., "Minimization of geometric beam broadening in a grating-based time-domain delay line for optical coherence tomography application," J. Opt. Soc. Am. A, vol. 24, pp. 3808-3818 (2007).

Chraplyvy, A.R., et al., "Phase modulation to amplitude modulation conversion of CW laser light in optical fiber," Electron. Lett., vol. 22, pp. 409-411 (1986).

Urick, V.J., and Bucholtz, F., Compensation of arbitrary chromatic dispersion in analog links using a modulation-diversity receiver, IEEE Photonics Technology Letters, vol. 17, pp. 893-895 (2005).

* cited by examiner

MICROWAVE PHOTONIC TRUE-TIME-DELAY

CROSS-REFERENCE TO RELATED APPLICATIONS

This application is a non-provisional under 35 USC §119 of, and claims the benefit of, U.S. Provisional Application 61/492,855 filed on Jun. 3, 2011, the entire disclosure of which is incorporated herein by reference.

BACKGROUND OF THE INVENTION

1. Technical Field

This is related to time delay devices for optical systems, and more particularly to time delay devices suitable for use in microwave photonics systems.

2. Related Technology

In microwave photonic systems, microwave signals are modulated onto optical carriers, transmitted and subsequently received by photodetectors to recover the amplitude and phase. Optical-domain, radio-frequency (RF) true-time-delay (TTD) lines with programmable time delays, wide bandwidth and low optical loss are key components of microwave photonic signal processing systems and future optical communications networks.

Their unique advantages, including low loss (independent of microwave frequency), large instantaneous bandwidth, immunity to electromagnetic interference, and parallel signal processing capability, have led to the realization of high-performance, tunable microwave filters, phased array beamformers, fast analog-to-digital converters, arbitrary waveform generators, signal correlators, and frequency converters and mixers.

For such applications, it is important that the delay lines exhibit low loss, wide RF bandwidth, minimal frequency-dependent loss and dispersion, as well as achievable time delays at least on the order of the RF period. In addition, rapid tuning speed and fine delay resolution are of interest for enabling higher-performance, more agile photonic systems. A. J. Seeds and K. J. Williams, "Microwave photonics," Journal of Lightwave Technology, Vol. 24, pp. 4628-4642 (December 2006), describes the history and development of the field of microwave photonics. R. A. Minasian, "Photonic signal processing of microwave signals," IEEE Transactions on Microwave Theory and Techniques, Vol. 54, pp. 832-846 (February 2006) discloses photonic signal processing techniques using optical delay lines for processing high bandwidth signals. R. S. Tucker, "The role of optics and electronics in high-capacity routers," Journal of Lightwave Technology, Vol. 26, pp. 4655-4673 (December 2006), discloses the potential for using optical delay lines as buffers for routers.

Although optical-domain, RF TTD lines have been demonstrated, relatively few are currently capable of fine-resolution tuning over an entire RF period at 10 GHz and above. Discrete fiber Bragg grating (FBG) delay lines are discussed in R. A. Minasian, "Photonic signal processing of microwave signals," IEEE Transactions on Microwave Theory and Techniques, Vol. 54, pp. 832-846 (February 2006). The discrete FBG delay lines, however, are limited to minimum delay increments of 10 ps, which translates to a coarse 36° RF phase step at 10 GHz.

K.-L. Deng, I. Glask, P. Prucnal, and K. I. Kang, "A 1024-channel fast tunable delay line for ultrafast all-optical TDM networks," IEEE Photon. Technol. Lett. Vol. 9, No. 11, pp. 1496-1498 (1997) discloses integrated-optic switch delay lines. These integrated-optic switch delay lines, on the other hand, can suffer from prohibitive optical loss at large bit-depths, and can be challenging to phase-trim to 1 ps.

D. A. Henderson, C. Hoffman, R. Culhane, D. Viggiano III, M. A. Marcus, B. Culsahw, and J. P. Dakin, "Kilohertz scanning, all-fiber optical delay line using piezoelectric actuation," Proc. SPIE vol. 5589, pp. 99-106 (2004) discloses piezoelectric fiber stretcher delay lines. These Piezoelectric fiber stretchers can provide both fine delay resolution and low optical loss, but are currently limited to tuning ranges on the order of 10 ps, over which the tuning can be slow.

Delay systems using chirped fiber gratings are disclosed in D. B. Hunter, M. E. Parker, and J. L. Dexter, "Demonstration of a continuously variable true-time delay beamformer using a multichannel chirped fiber grating", IEEE Trans. Microw. Theory Tech., Vol. 54, No. 2, pp. 861-867 (2006), and in B. Zhou, X. Zheng, X. Yu, H. Zhang, Y. Guo, and B. Zhou, "Impact of group delay ripples of chirped fiber grating on optical beamforming networks," Opt. Express, Vol. 16, No. 4, pp. 2398-2404 (2008). However, delay lines based on chirped FBGs can suffer from group delay ripple (non-linear variations in group delay across the optical bandwidth) at high frequencies, typically on the order of 10 ps, which limits the achievable phase and amplitude control.

Other approaches for finely-tunable TTD at 10 GHz include linearly-translated mirror, 3D linear switch array and highly-dispersive fiber delay lines.

3D linear switch arrays are disclosed in V. Kaman, R. J. Xuezhe Zheng, C. Helkey, C. Pusarla, and J. E. Bowers, "A 32-element 8-bit photonic true-time-delay system based on a 288×288 3-D MEMS optical switch," IEEE Photon. Technol. Lett., Vol. 15, No. 6, pp. 849-851 (2003). Highly-dispersive fiber delay lines are disclosed in M. Y. Frankel, P. J. Matthews, and R. D. Esman, "Fiber-optic true time steering of an ultra-wide-band receive array," IEEE Trans. Microw. Theory Tech., Vol. 45, No. 8, pp. 1522-1526 (1997). The fiber delay lines can provide a continuously-tunable time delay via either a tunable laser, as described by Frankel et. al, by via a nonlinear optical wavelength conversion process, described in N. Alic, J. R. Windmiller, J. B. Coles, and S. Radic, "Two-pump parametric optical delays," IEEE J. Sel. Top. Quantum Electron. 14(3), 681-690 (2008).

The 3D linear switch approach can be expensive, however, because at least N switchable, phase-trimmed paths are required to realize N programmable delay levels (a linear architecture is necessitated by the small incremental delay). Translated mirrors, on the other hand, are relatively slow. Dispersive fiber delay lines can suffer from poor tuning speed when using high-performance, tunable distributed-feedback (DFB) lasers, because temperature stabilization within a small fraction of the full temperature tuning range is rather slow. Rapidly-tunable lasers can be substituted to provide faster tuning, but this comes at the expense of increased laser noise and reduced power, which ultimately impacts system performance.

Scanning delay lines developed for optical coherence tomography (OCT) are described in D. Piao and Q. Zhu, "Power-efficient grating-based scanning optical delay line: time-domain configuration," Electronics Letters, Vol. 40, pp. 97-98 (2004), and in Z. Jiang, Q. Zhu and D. Piao, "Minimization of geometric beam broadening in a grating-based time-domain delay line for optical coherence tomography application," J. Opt. Soc. Am. A, Vol. 24, pp. 3808-3818 (2007).

There is continued interest in developing optical TTD delay lines capable of rapid tuning and fine delay resolution at 10 GHz and beyond.

BRIEF SUMMARY OF THE INVENTION

An aspect of the invention is directed to a time delay device for introducing a time delay into an optical beam, the optical beam being an optical carrier wave modulated with a lower frequency signal. The time delay device includes a beam deflector; an imaging device configured to image optical beam onto the beam deflector; a stationary diffractive grating arranged in an optical path with the beam deflector; and a focusing element arranged between the beam deflector and the stationary diffractive grating. In operation, the beam deflector directs the optical beam across the clear aperture of the focusing element, and the focusing element transmits the beam to the reflective diffractive grating, wherein a change in optical path length experienced by the optical beam as the beam moves across the grating surface results in a relative phase delay in the optical beam.

The stationary diffractive grating can be aligned in Littrow configuration with respect to said second focusing element. The stationary diffractive grating can be a reflective diffractive grating, and in operation, the stationary diffractive grating reflects the optical beam into a return optical path through the focusing optical element and the beam deflector. Alternatively, the stationary diffractive grating can be a transmissive diffractive grating, and the system further comprises a mirror positioned on an opposite side of the diffractive grating, arranged to reflect the optical beam in a return optical path through the diffractive grating, the focusing optical element, and the beam deflector.

The lower frequency signal is a microwave signal with a center frequency between one gigahertz and ten terahertz. The beam deflector can be a rotatable mirror, an acousto-optic beam deflector, or an electro-optic beam deflector adapted to control the beam deflection angle responsive to an applied tuning voltage. If the beam deflector is an acousto-optic beam deflector, a wave plate can also be arranged in the optical path between the acousto-optic beam deflector and the reflective diffractive grating. The imaging device for imaging the optical beam onto the beam deflector can be a lens or a curved mirror, the mirror preferably having a spherical surface or parabolic surface. The optical beam that is imaged onto the beam deflector can be carried on an optical fiber, such as a single mode optical fiber. The system can also include a fiber optic circulator configured to separate the input optical beam and a delayed output optical beam.

Another aspect of the invention is directed to a method for delaying an optical beam, the optical beam being an optical carrier modulated with a lower frequency signal. The method includes imaging the optical beam onto a beam deflector; deflecting the optical beam, by the beam deflector, such that the optical beam is swept across the surface of a focusing optical element, the focusing optical element transmitting the swept deflected optical beam to a stationary diffractive grating configured in a Littrow configuration. A change in optical path length experienced by the optical beam as the beam is scanned across the grating surface results in a relative phase delay in the optical beam.

In implementing this method, the stationary diffractive grating can be aligned in Littrow configuration with respect to said second focusing element. The stationary diffractive grating can be a reflective diffractive grating, and in operation, the stationary diffractive grating reflects the optical beam into a return optical path through the focusing optical element and the beam deflector. Alternatively, the stationary diffractive grating can be a transmissive diffractive grating, and the system further comprises a mirror positioned on an opposite side of the diffractive grating, arranged to reflect the optical beam in a return optical path through the diffractive grating, the focusing optical element, and the beam deflector. The lower frequency signal can be a microwave signal with a center frequency between one gigahertz and ten terahertz. The beam deflector can be a rotatable mirror, an acousto-optic beam deflector, or an electro-optic beam deflector adapted to control the beam deflection angle responsive to an applied tuning voltage. If the beam deflector is an acousto-optic beam deflector, a wave plate can also be arranged in the optical path between the acousto-optic beam deflector and the reflective diffractive grating. The imaging device for imaging the optical beam onto the beam deflector can be a lens or a curved mirror, the mirror preferably having a spherical surface or parabolic surface. The optical beam that is imaged onto the beam deflector can be carried on an optical fiber, such as a single mode optical fiber. It can also be suitable to provide a fiber optic circulator configured to separate the input optical beam and a delayed output optical beam.

Another aspect of the invention is directed to a method and system for testing a microwave photonic system. The method includes providing a Mach Zehnder interferometer, having a first arm with a photonic link, a delay line, and an amplifier arranged to amplify the output of the photonic link and delay line, and having a second arm with an attenuator configured to match the power at an output of the amplifier in the first arm; providing a bandpass filter arranged at the output of the Mach Zehnder interferometer, the band pass filter having a pass band that includes the center frequency of a continuous wave microwave signal applied to the Mach Zehnder interferometer; applying the microwave signal to the input of the Mach Zehnder interferometer; applying a signal to the second arm with the photonic link and delay line; and measuring an output of the bandpass filter with an oscilloscope and a microwave power detector. A variable length microwave transmission line can be included in one arm of the interferometer to modify the interference signal.

Additional details will be apparent from the following detailed description.

DETAILED DESCRIPTION OF EMBODIMENTS OF THE INVENTION

Figure 1:
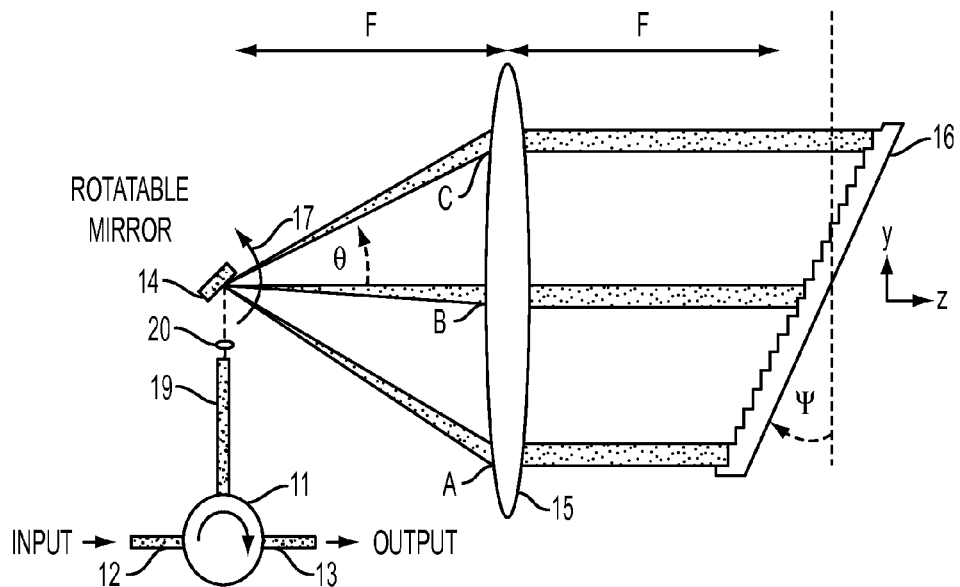
FIG. 1 illustrates a time delay line system in accordance with an embodiment of the invention.

Several time delay systems are described herein that can provide a continuously tunable, true time delay line capable of rapid tuning and fine delay resolution at 10 GHz and above.
Example of Beam-Steered Diffraction Grating True Time Delay System FIG. 1 illustrates a true time delay system 10. In this example, a fiber optic circulator 11 or other input/output device receives optical energy from an input optical fiber 12, returns the delayed optical energy to an output optical fiber 13, while separating the input and output optical beams. A beam deflector 14 scans an optical beam across a stationary reflective diffraction grating 16.

In this example, the input optical beam is an optical carrier, preferably modulated with an electronic signal having a lower frequency than the optical carrier. The signal can be a microwave signal having a frequency between about 1 GHz and 10 THz. In the following discussion, the terms "RF" and "microwave" are used interchangeably to refer to the signals in this general frequency range that are modulated on the optical carrier. The system 10 is configured to produce a true time delay for the modulated signals on the optical carrier, as described below.

In this example, the beam deflector 14 is a rapidly rotating mirror, which can be either a manually rotated mirror, a rapid-scanning mirror, or another fast-scanning deflector device. The mirror is aligned so the mirror's rotation axis coincides with the mirror's reflection point.

The optical energy from the fiber optic circulator is imaged onto the rotatable mirror 14, by a means for imaging, which can be, for example, a lens 20 positioned near the end of the optical fiber 19. The distance from the end of the fiber to the lens 20 and from the lens 20 to the mirror 14 are chosen to provide a beam waist at the mirror, with proper size to allow both wide spectral bandwidth and wide delay tuning range. The lens 20 is appropriately sized for the optical fiber. For example, the lens 20 can be a few millimeters in diameter.

A second, larger lens 15 is positioned between the beam deflector 14 and the stationary reflective diffraction grating 16, with the reflection point of the beam deflector 14 positioned at a focal point of the lens, and the stationary diffraction grating center point positioned at the back focal point of the lens 15.

The stationary reflective diffraction grating 16 is preferably aligned in Littrow configuration at the angle $\psi$.

As the rotatable mirror rotates, the mirror deflects the input optical beam through a varying beam deflection angle $\theta$, steering or directing the beam so it is scanned across the lens 15. For example, as the mirror 14 rotates in the direction shown by arrow 17, the beam is steered across the lens from location A to location B, then to location C. Intermediate points on the lens are not shown for clarity. The mirror then rotates in the opposite direction, steering the beam from location C, to location B, then to location A. The rotatable mirror can be driven by a motor and controller, not shown.

At a beam deflection angle $\theta$, the lens redirects the deflected beam 18, such that the beam 18 exiting the lens is parallel to the optical axis, but offset by a distance y from a line through the center of the lens 15 (where $\theta=0$), with y being $$y = F \tan \theta \tag{1}$$

where F is the focal length of the lens 15.

The stationary reflective diffraction grating 16, located in the back focal plane of the lens, reflects the beam back along its original path. Due to the angle of the grating $\psi$ with respect to the back focal plane of the lens, rotating the mirror steers or directs the beam across the diffractive grating, thus changing the optical path length through the system. The optical path length change results in a mirror-controlled relative phase delay of $$\tau = \frac{2y \tan \psi}{c} = \frac{2F \tan \psi \tan \theta}{c} \tag{2}$$

where c is the speed of light in a vacuum. The corresponding relative group delay, $\tau_g$, is equal to $$\tau_g = \tau + f \frac{d\tau}{df}$$

where f is the frequency.

Note that the focal length of a lens does not vary significantly with frequency, and the other parameters of equation (2) remain fixed, so equation (2) has negligible frequency dependence, and the relative group delay $\tau_g$ will be essentially identical to the phase delay. Therefore, the following discussions neglect any distinctions between phase and group delay, and the term "delay" is used interchangeably.

The system 10 produces a controllable, optical true-time-delay, and as such, also provides a true-time-delay of the modulated microwave signal. In addition, the system provides a true-time-delay without introducing significant optical dispersion, which could degrade the modulated signals by introducing AM-PM conversion and/or pulse broadening.

Figure 2:
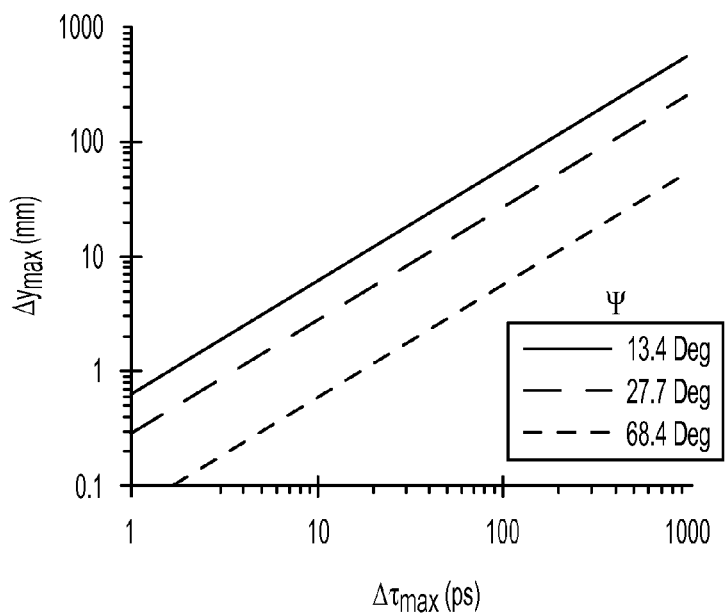
FIG. 2 illustrates the relationship between the lens clear aperture and the maximum delay tuning range, for a system with a diffraction grating in the Littrow configuration for several grating reflectance angles.

The optical energy transmitted out of the end of the optical fiber 19 is imaged onto the rotating mirror with a lens 20. In particular, the lens 20 is positioned between the end of the optical fiber and the rotatable mirror so the rotatable mirror 14 is located at the beam waist of the optical beam emitted from the optical fiber, which is an RF signal modulated onto an optical carrier. FIG. 2 illustrates the relationship between the lens clear aperture and the maximum delay tuning range, for a system with a diffraction grating in the Littrow configuration for several grating reflectance angles $\psi$ at an optical wavelength of 1.55 microns. In FIG. 2, the $\Delta y_{max}$ is the radius of the lens clear aperture in millimeters, and the $\Delta \tau_{max}$ is the maximum delay in picoseconds.

Based on FIG. 2, a 50 mm achromatic doublet lens with a 40 mm clear aperture and a 100 mm focal length, and a 50 mm wide diffraction grating with 600 grooves per millimeter, aligned at an angle ψ of 27.7 degrees can provide up to 140 picoseconds of delay tuning range at an optical wavelength of 1.55 microns.

Figure 3:
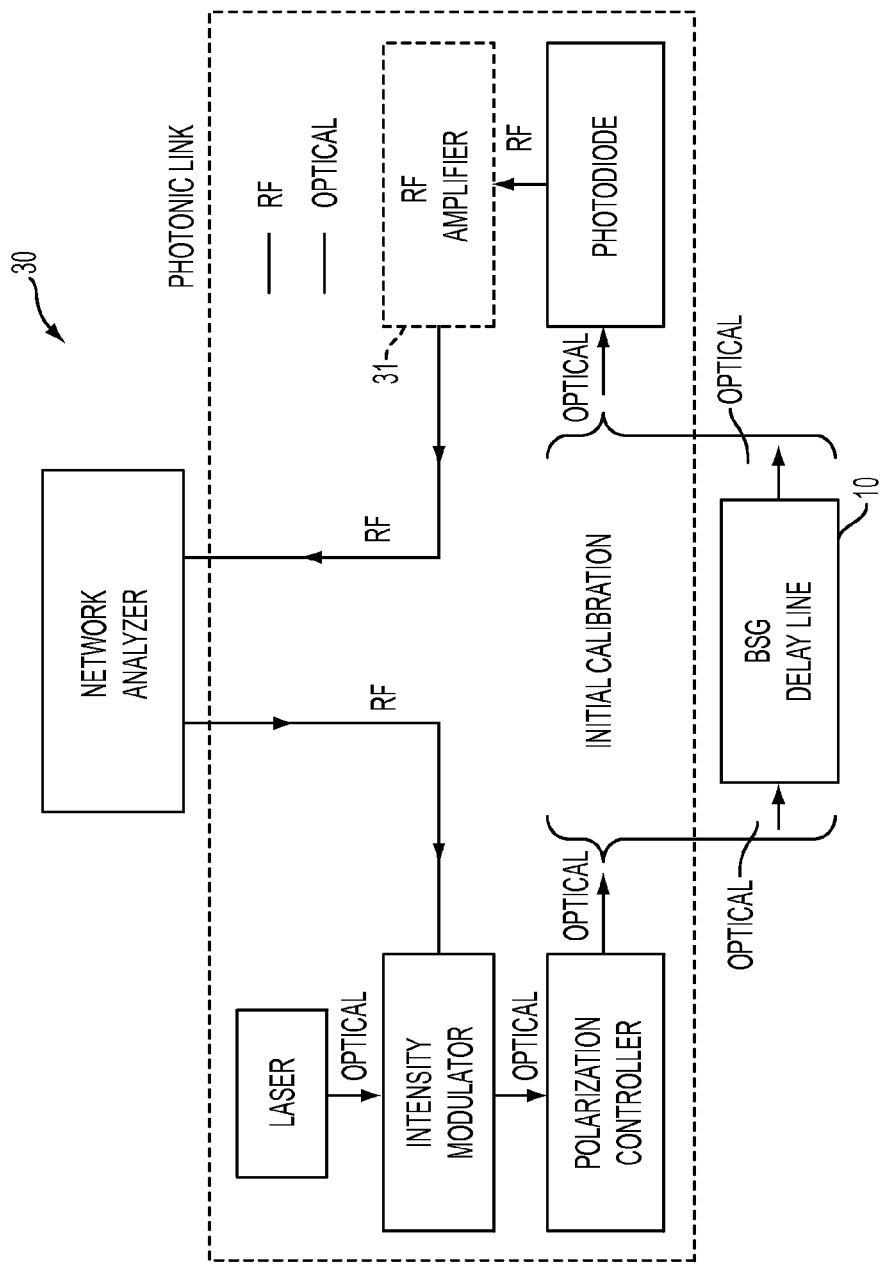
FIG. 3 illustrates a test set-up for evaluating the time delay line system of FIG. 1.
Figure 4B:
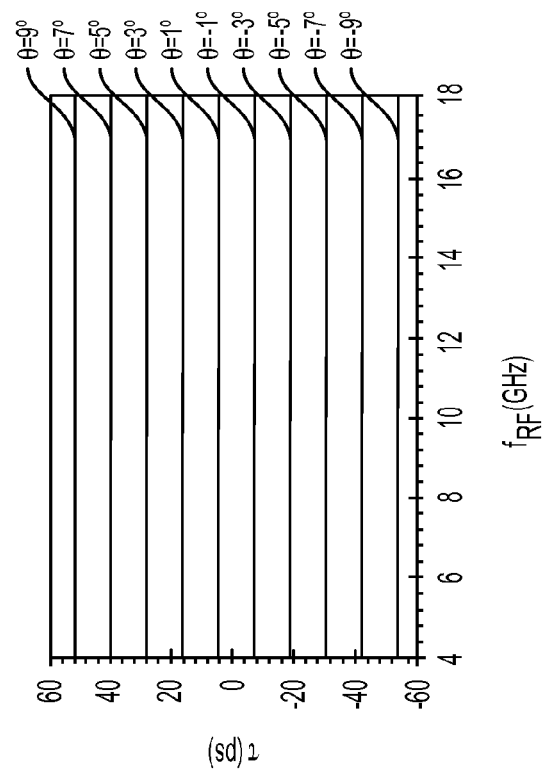
FIGS. 4A and 4B are graphs illustrating the measured RF phase and the corresponding RF phase delay τ versus microwave frequency for different beam deflection angles.
Figure 4A:
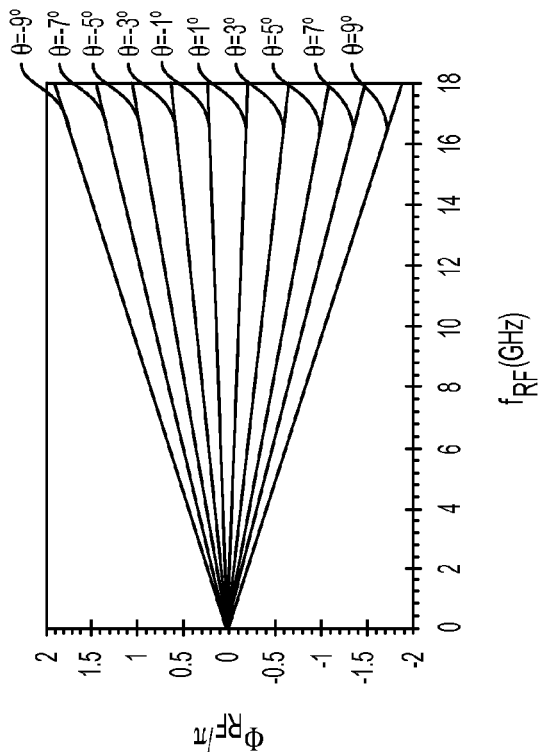

The RF response of the beam-scanned grating delay line system 10 according to FIG. 1 (and with a 50 mm achromatic doublet lens with a 40 mm clear aperture and a 100 mm focal length, and a 50 mm wide diffraction grating with 600 grooves per millimeter, aligned at an angle ψ of 27.7 degrees) is characterized using the experimental set-up 30 shown in FIG. 3. The photonic link includes a 16 GHz Mach-Zehnder intensity modulator, a 1.55 micron distributed feedback (DFB) laser, a fiber-loop polarization controller, and a reverse-biased 18 GHz photodiode. A 6-18 GHz low noise RF amplifier 31 is also included for measurements ranging from 4 to 18 GHz, but is not included for lower frequency tests below 4 GHz. For both sets of measurements, a calibration run is first performed through the photonic link, after which the BSG delay line system 10 is added to the test configuration in order to determine the RF response of the system 10. FIG. 4A plots the measured microwave phase versus microwave frequency for beam deflection angles between θ=−9 degrees and θ=+9 degrees, after adjustment for a common 7.8558 nanosecond phase delay measured at θ=0. FIG. 4B illustrates the corresponding relative microwave phase delay τ, calculated using the equation $$\tau = \frac{-\Phi_{RF}}{2\pi f_{RF}} \quad (3)$$

where $f_{RF}$ is the RF frequency.

Note that the RF phase delay in FIG. 4B is independent of frequency, within the measurement accuracy of the test, indicating that the delay line 10 provides a true RF time delay as the beam was deflected. In addition, the standard deviation of the delay ranges from 60 to 160 femtoseconds for the curves in FIG. 4B, when calculated over the 6-18 GHz amplifier bandwidth. Although these values include measurement error due to imperfect network analyzer calibration, taken as an upper bound, they represent a one to two order of magnitude improvement in delay ripple compared to chirped fiber Bragg grating delay systems. The test results indicate that the beam-steered diffraction grating delay line 10 has the potential to provide high-resolution time delay control in the high GHz range.

Figure 5B:
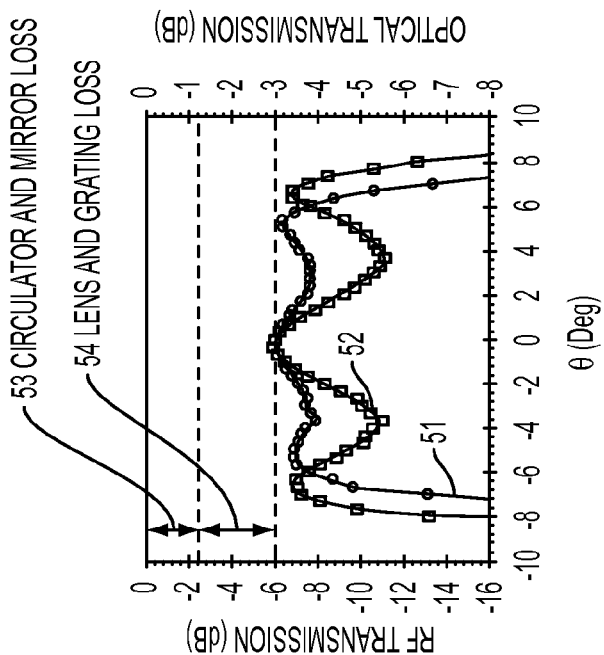
FIG. 5B shows the variation in measured RF power transmission and derived optical power transmission with the beam deflection angle θ.
Figure 5A:
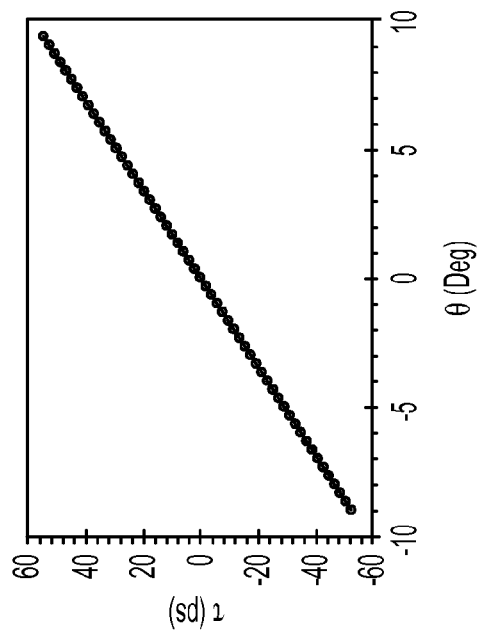
FIG. 5A shows the relationship between the microwave phase delay and the beam deflection angle θ.

FIG. 5A shows the relationship between the microwave phase delay and the beam deflection angle θ. A linear least-squares fit of the data produced a slope of 5.96 picoseconds per degree, which is in good agreement with equation (2). FIG. 5B plots the variation in both measured RF power transmission $|S_{21}|^2$ and derived optical power transmission (calculated as $|S_{21}|$) with the beam deflection angle θ. Data for two different lens-to-mirror distances are shown. Curve 51 is for a lens-to-mirror distance close to the paraxial focal length of the lens, and curve 52 has a lens-to-mirror distance that has been adjusted slightly to focus non-paraxial rays.

The curves 51 and 52 show that the loss varies significantly with deflection angle, and improves at large angles as the lens is defocused, indicating that there is significant spherical aberration in the as-tested system. The spherical aberrations will limit the useful delay tuning range to less than the theoretical limit of 140 picoseconds. It is believed that this can be mitigated with better optics. Nevertheless, FIG. 5B demonstrates a RF power ripple of less than 3 dB over a 12.8 degree beam deflection range, and less than 6 dB over 15.8 degrees, corresponding to the delay tuning ranges 76.3 ps and 94.2 ps, respectively. FIG. 5B also shows that the optical insertion loss of the delay line is 2.95 dB (5.9 dB RF). Of this, 1.25 dB loss 53 is attributed to losses in the fiber-optic circulator and mirror, determined by measuring the back-reflected signal with the mirror rotated to normal incidence. The remaining 1.7 dB optical transmission loss 54 is attributed to imperfect grating efficiency and reflections from an improperly antireflection-coated lens. In addition, 2.35 dB of optical polarization-dependent loss was observed as the fiber polarization controller was varied. However, it is believed that this loss might have been avoided by using polarization maintaining (PM) fiber.

Figure 6:
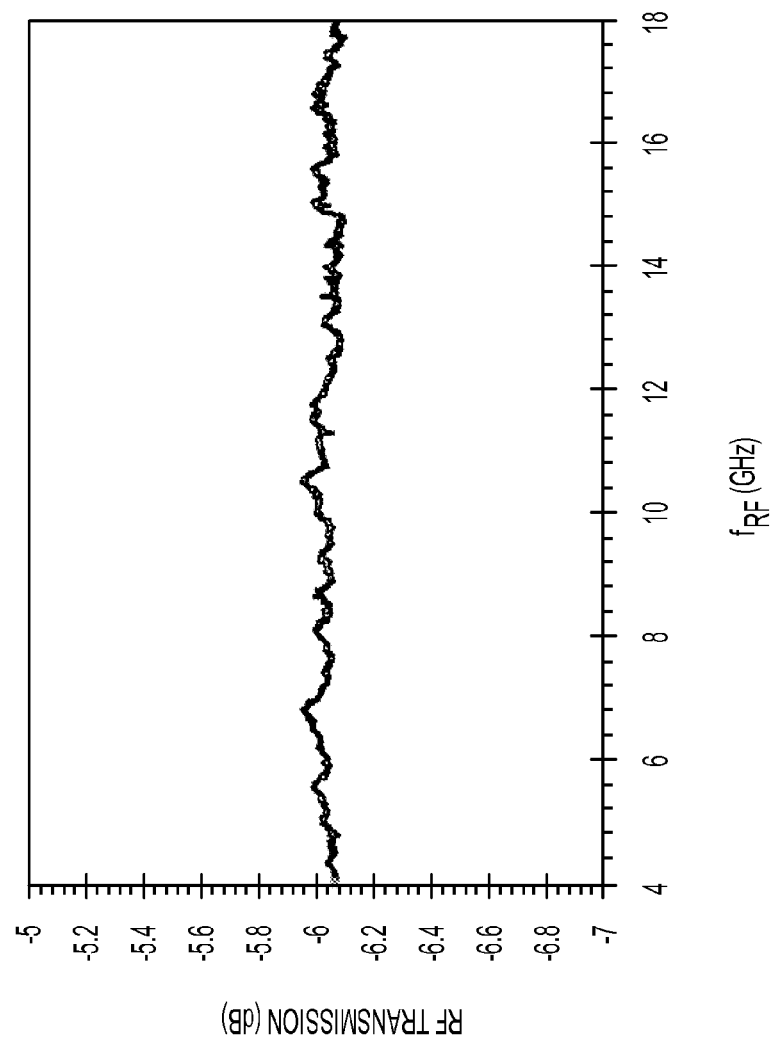
FIG. 6 plots the RF power transmission versus microwave frequency at a beam steering angle of zero.

The microwave power transmission is plotted versus frequency in FIG. 6 for a beam steering angle of θ=0. As shown, the microwave power transmission is independent of frequency (within the measurement accuracy), which indicates that in addition to providing true microwave time delay, the beam-steered grating delay line 10 provides a flat amplitude response throughout the 4-18 GHz measurement range. Similarly flat responses were observed for all the beam deflection angles (−9, −7, −5, −3, −1, +1, +3, +5, +7, and +9 degrees).

Theoretical Limits on Operating Frequency and Achievable Time Delay Based Gaussian Beam Optics A few comments are provided regarding the possible theoretical limits of a beam-steered grating delay line. These comments are provided to assist in system design, and are not intended to limit the scope of inventions disclosed in this patent application in any way.

Figure 7:
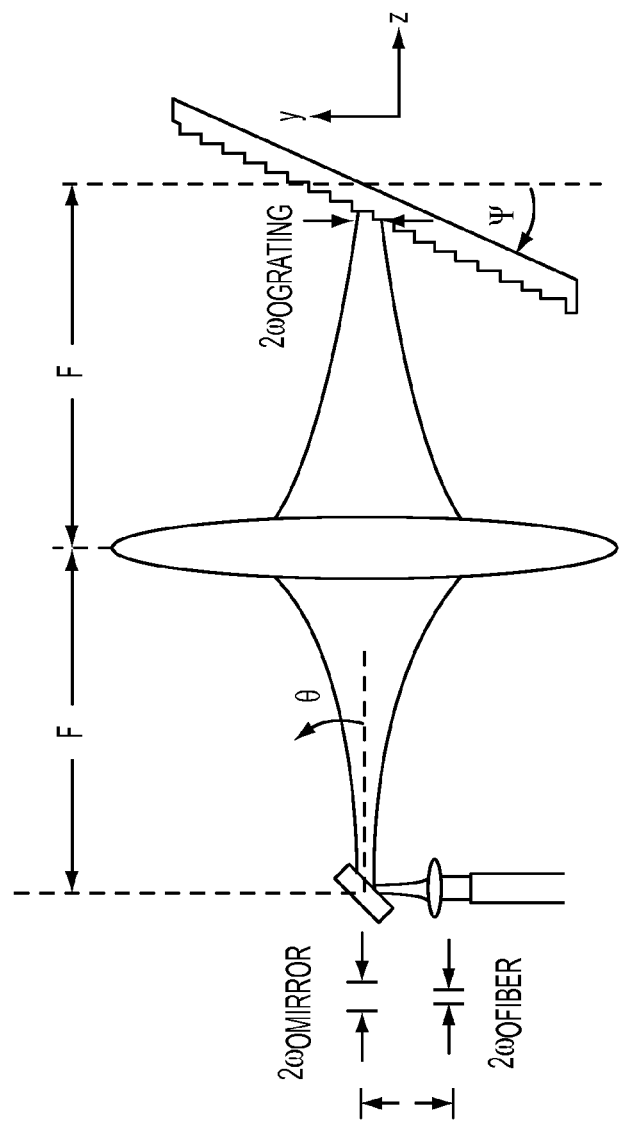
FIG. 7 illustrates the operation of the time delay system of FIG. 1 in more detail.

The range of frequencies over which the beam-steered grating delay line design is feasible, and the range of time delays it can reasonably be expected to provide, are potentially limited by spectral beam broadening at the diffraction grating, inherent variations in the optical path length resulting from the tunable delay, and practical device size. Each of these effects can be analyzed in the framework of Gaussian beam optics. In this framework, the output of the optical fiber is approximated as a Gaussian beam, with waist $\omega_{0fiber}$ located at the fiber end face, as shown in FIG. 7. The beam is then imaged onto the face of the mirror, forming a waist of size (e.g., beam radius) $\omega_{0mirror}$. The reflected beam then passes through the lens and is projected to a waist with size $\omega_{0grating}$ at the back focal plane of the lens. With λ representing the wavelength, the relationship between the beam waist at the mirror and the beam waist at the back focal plane of the lens is given by $$\omega_{0mirror}\omega_{0grating} = \frac{F\lambda}{\pi}. \quad (4)$$

Spectral beam broadening originates at the diffraction grating, which converts the nonzero wavelength spread Δλ of the optical beam (and corresponding frequency spread $2f_{RF}$) to the angular spread $$\Delta\alpha = \frac{|m\psi|\Delta\lambda}{\lambda} = \frac{2|m\psi|f_{RF}}{f_{carrier}}, \quad (5)$$

where m is the grating diffraction order and $f_{carrier}$ is the optical carrier frequency. The lens converts this angular spread to a spatial variation, $\Delta\gamma_{mirror}=F\Delta\alpha$, at the mirror. This spatial spread must be small compared to the beam diameter at the mirror to prevent substantial optical loss. Taking $\Delta\gamma_{mirror} \leq 2\omega_{0mirror}$ as a practical limit, and making use of Eqs. (4) and (5), leads to the restriction on the size of the beam waist at the grating:

$$\omega_{0grating} \leq \frac{c}{m\pi\psi f_{RF}}. \quad (6)$$

Equation (6) defines the maximum size of the beam waist at the grating that will result in the delayed optical beam being efficiently received into the optical fiber end. The corresponding maximum beam diameter, $2\omega_{0grating(max)}$, is plotted versus RF frequency in FIG. 8A for three different grating angles $\psi$=13.4 degrees, 27.7 degrees, and 68.4 degrees. The curves in FIG. 8A shows that spectral broadening does not place any fundamental restriction on modulation frequency over the range of 1 GHz to 10000 GHz (10 THz). Similar curves that were plotted for the minimum beam diameter at the mirror did not provide additional insight, except to highlight that the beam waist at the grating, which controls the frequency cutoff of the delay line, is directly linked to the size of the beam waist at the mirror. By imaging the optical fiber output onto the rotatable mirror, the size of both waists can be appropriately controlled.

Varying the optical path length of the system to impart a time delay can also affect the optical throughput. Its impact can be gauged by noting that although the beam waist $\omega_{0grating}$ is initially projected to the back focal point of the lens, upon reflection its (virtual) distance from the lens will vary by the amount $\Delta z_{grating}$, where $$\Delta z_{grating} = c\Delta\tau_{max}. \quad (7)$$

It can be shown that this variation in waist position at the grating produces a corresponding variation in waist position at the fiber, $\Delta z_{fiber}$, given by $$\frac{\Delta z_{fiber}}{z_{0fiber}} = \frac{\Delta z_{grating}}{z_{0grating}} \quad (8)$$

where $z_{0fiber}$ and $z_{0grating}$ are the Rayleigh ranges at the fiber and grating, respectively.

Although the variation in waist position at the grating also produces some lateral beam broadening, as shown in later paragraphs, this effect is small. The variation in the waist position at the fiber must be small compared to the Rayleigh range to prevent substantial optical loss. Taking $\Delta z_{fiber} \leq 2z_{0fiber}$ as a practical limit, and making use of the definition $z_0 = \pi\omega_0^2/\lambda$ leads to a lower limit on the size of the beam waist at the grating:

$$\omega_{0grating} \geq \sqrt{\frac{c\lambda\Delta\tau_{max}}{2\pi}} \quad (9)$$

Figure 8B:
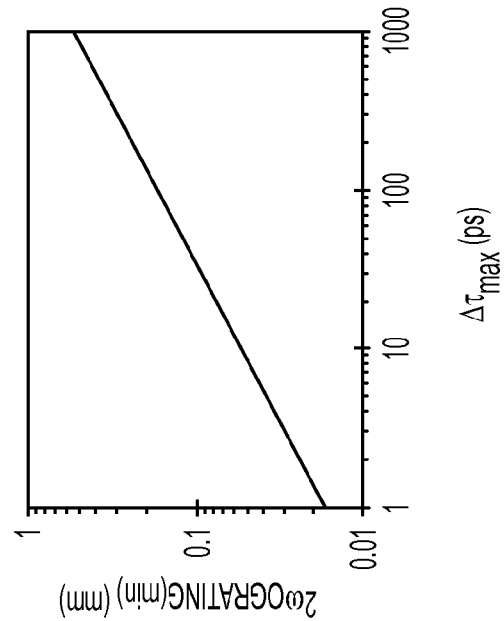
FIG. 8B plots a theoretical minimum beam diameter at the diffraction grating due to the changing system optical path length versus microwave frequency.
Figure 8A:
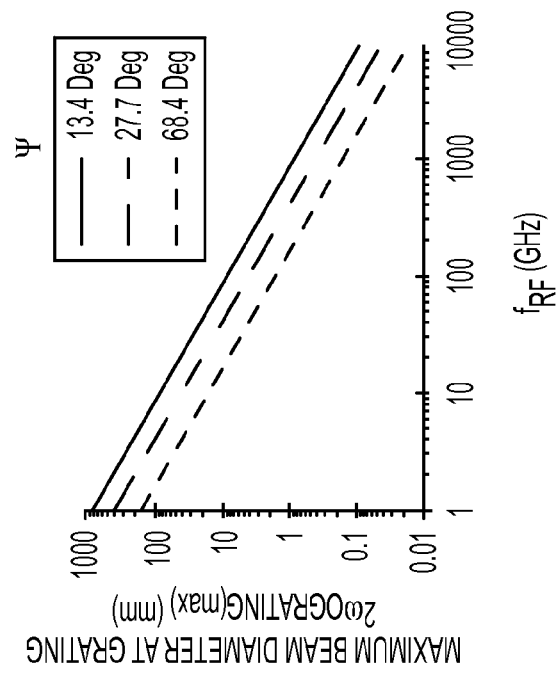
FIG. 8A plots a theoretical maximum beam diameter at the diffraction grating versus frequency due to spectral beam broadening.

The corresponding minimum beam diameter, $2\omega_{0grating(min)}$, is plotted versus RF frequency in FIG. 8B.

Thus, the most significant restrictions on time delay tuning range appear to be based on overall device size. FIG. 2 indicates that a delay tuning range of 100 picoseconds should be possible with a 60 mm clear aperture. Scaling to much larger tuning ranges, however, may require large optics and long focal lengths, which can impose practical limitations on the achievable delay tuning range.

Lateral Beam Broadening Effect

As mentioned above, the variation in waist position at the grating produces some lateral beam broadening, as follows. Referring to FIG. 1 and FIG. 7, note that the output of the optical fiber will be reflected off the rotatable mirror, approach the lens at angle $\theta$, and then be imaged at the back focal plane of the lens, at a distance y=F tan $\theta$ from the optical axis. Since the light will not be reflected from the back focal plane of the lens, but instead at the grating located the distance y tan $\psi$ past the back focal plane, the reflected beam will appear to issue from a virtual source located 2y tan $\omega$ past the back focal plane. The effect of this shift in z is to shift the image in z at the mirror, an effect which has been accounted for in equation (8) and leads directly to equation (9).

If one considers the spectral width of the beam as well, reflection from the grating will induce the angular spread $\Delta\alpha$, which serves to spread the location of the virtual source by a maximum amount $\Delta y'_{grating} = \Delta\alpha |y \tan \psi|_{max}$. The prime symbol is used to distinguish this effect, denoted geometric beam broadening, from that of spectral beam broadening discussed above regarding equations (5)-(9).

By substituting Eq. (1), (2) and (5), and making use of the simplifying assumption $\Delta\tau_{max} = 2|\tau|_{max}$, this expression reduces to $$\Delta y'_{grating} = \frac{c\Delta\tau_{max}\Delta\alpha}{2}. \quad (10)$$

The transverse beam spread at the grating in turn translates to a beam spread at the mirror $\Delta y'_{mirror}$ according to $$\frac{\Delta y'_{grating}}{2\omega'_{0grating}} = \frac{\Delta y'_{mirror}}{2\omega'_{0mirror}}. \quad (11)$$

Next, applying the condition $\Delta y'_{mirror} \leq 2\omega'_{0mirror}$ introduced above leads to the restriction $$\omega'_{0grating} \geq \frac{c\Delta\tau_{max}\Delta\alpha}{4}. \quad (12)$$

The ratio of the minimum beam waist allowed by equation (12) to that allowed by equation (9) is $$\frac{\omega'_{0grating(min)}}{\omega_{0grating(min)}} = \frac{\pi\Delta\alpha\omega_{0grating(min)}}{4\lambda}. \quad (13)$$

With the aid of equation (5) and (6), this reduces to $$\frac{\omega'_{0grating(min)}}{\omega_{0grating(min)}} = \frac{n\omega_{0grating(min)}}{2\omega_{0grating(max)}}, \quad (14)$$

where n is the optical refractive index. For any useful implementation of the device, this ratio will be less than one. Thus, the restriction on waist size at the grating due to geometric beam broadening, given by equation (12), will inherently be satisfied by equation (9).

The preceding description and the illustrations of FIG. 1 through FIGS. 8A and 8B demonstrate a beam-scanned diffraction grating delay line suitable for high-resolution microwave phase control over at least one microwave period at modulation frequencies of 1-100 GHz. Lower-resolution phase control is also possible well into the THz. The observed 75 ps of continuously-tunable microwave true-time-delay provided full-cycle tuning of the microwave phase at 13.3 GHz and beyond. Predictions show that the tuning range may be scaled to at least 1000 ps. Although the beam deflector in this example of FIG. 1 is a manually-rotated mirror, the system can also be implemented using a rapid-scanning mirror or other fast beam deflector technologies, to enable high-speed, continuously-tunable optical and RF TTD.

It can also be suitable to use alternative optical components in the system 10. For example, a fiber optic coupler could be used in place of the fiber optic circulator 11, however, fiber optic couplers typically would typically provide more round trip loss than fiber optic circulators.

The present systems has several advantages over previous time delay systems developed for optical coherence tomography. For example, the present system 10, images, rather than collimates, the optical beam onto the beam deflector. In addition, the system 10 produces a RF true time delay for modulated signals on an optical carrier, as opposed to an optical delay for optical coherence measurements. Because the OCT measurements cannot sample the optical frequency in steps less than $1/\Delta\tau_{max}$, where $\Delta\tau_{max}$ is the total delay tuning range, they cannot adequately characterize delay line frequency variations across a typical microwave bandwidth. In comparison, the present system 10 provides a beam-scanned diffraction grating (BSG) delay line for true-time delay of coherent, modulated optical signals. Specifically, the system 10 has been demonstrated to provide 75 ps of continuous tuning range, 3 dB optical insertion loss, and minimal RF amplitude and group delay variation across the 4-18 GHz modulation range. The second example of a time delay system, described below, has the same advantages of the lens and rotatable mirror-based system 10, with improved performance due to the lack of chromatic dispersion and increased speed of beam deflection.

Second Example of a Beam-Steered Diffraction Grating True Time Delay System

Figure 9:
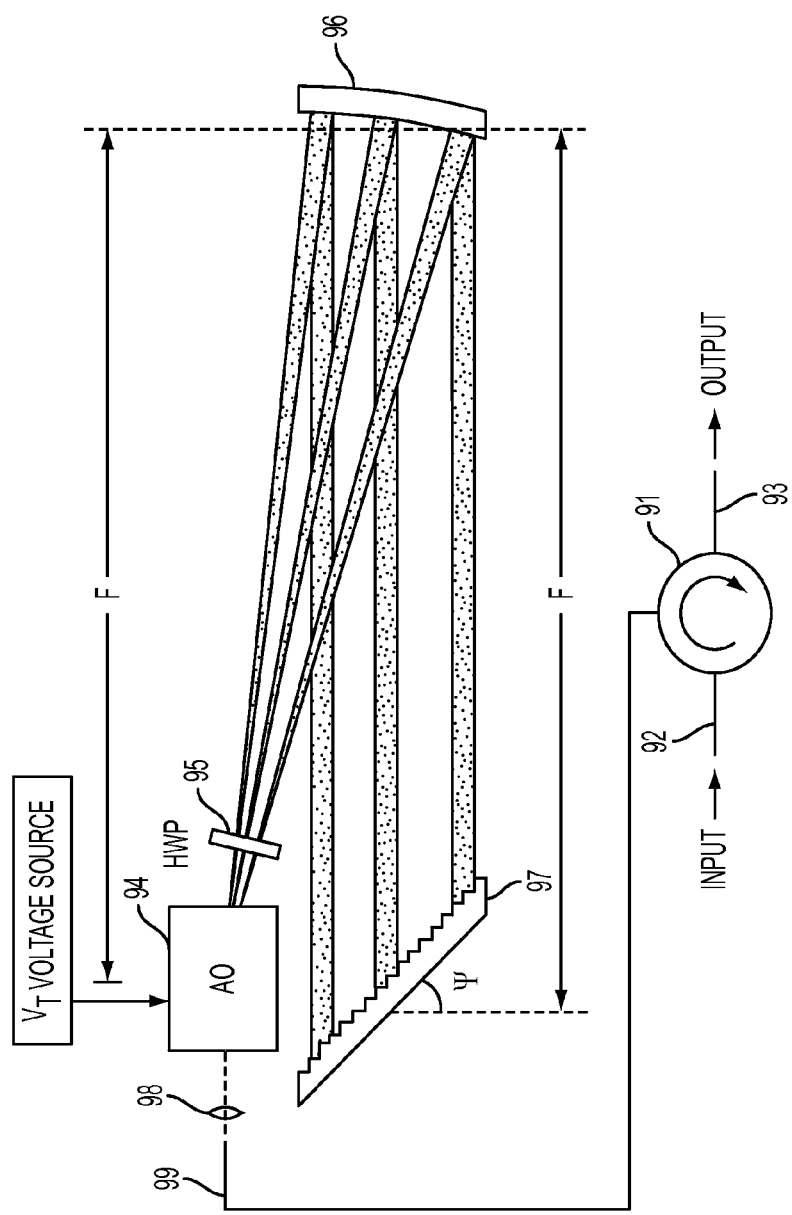
FIG. 9 illustrates another example of a beam-scanned grating true time delay line.

FIG. 9 illustrates another exemplary embodiment of a beam-scanned diffractive grating true-time-delay system 90.

In this example, a fiber optic circulator 91 or other input/output device receives optical energy from an input optical fiber 92, returns the delayed optical energy to an output optical fiber 93, while separating the input and output optical beams.

The beam deflector 94 is an acousto-optic beam deflector, having a much faster rate of beam deflection than the rotating mirror in the system 10 in FIG. 1. The reflective diffractive grating 97 is arranged in the Littrow configuration at an angle ψ. A curved focusing mirror 96 is arranged in the optical path between the beam deflector 94 and the reflective diffractive grating 97. The focusing mirror 96 is preferably located one focal length from the beam deflector 94 and one focal length from the reflective diffractive grating 97.

A half-wave plate 95 can be arranged in the optical path between the beam deflector 94 and the focusing mirror 96 near the acousto-optic beam deflector, to compensate for the polarization dependencies of the particular model of acousto-optic beam deflector and the diffraction grating.

In operation, the beam deflector 94 scans an optical beam across the focusing mirror 96. The curved mirror 96 transmits the optical beam to the stationary reflective diffraction grating 97. The curved mirror 96 can be a parabolic or spherical reflector.

In this example, the input optical beam is preferably an optical carrier modulated with RF signals, carried on a single-mode optical fiber 92. A fiber-optic circulator 91 separates the input and output optical beams.

The output of the single-mode optical fiber 99 from the fiber circulator is imaged into beam deflector cell 94, which allows the beam deflection angle to be rapidly controlled via a tuning voltage $V_T$. In this example, the beam deflector cell 94 is an acousto-optic beam deflector, although an electro-optic beam deflector is also suitable. The deflected beam is then reflected off a spherical collimating mirror 96, and subsequently retro-reflected back along its original path by a diffraction grating 97 aligned in Littrow configuration. Due to the inclination of the grating, changes in the AO deflection angle alters the round-trip optical path length through the system. Imaging means or an imaging device, e.g., a small lens 98, images the optical energy onto the beam deflector cell 94.

Figure 10:
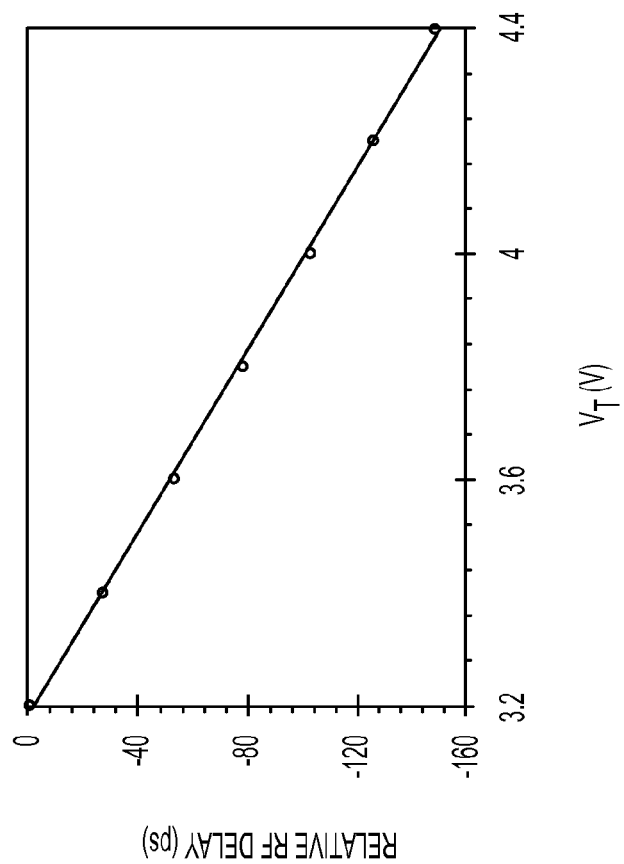
FIG. 10 illustrates the measured microwave true time delay versus the acousto-optic deflector tuning voltage for the system in FIG. 9.

When the delay line system 90 is included in a photonic link, this change in optical path length produces an identical change in microwave path length. FIG. 10 illustrates the measured microwave true time delay (relative microwave delay in picoseconds) versus the acousto-optic deflector tuning voltage, as measured using a network analyzer over the range of 6-18 GHz. The measured 150 ps delay is sufficient to provide microwave phase tuning over at least a full RF period at 6.7 GHz and above.

Figure 11:
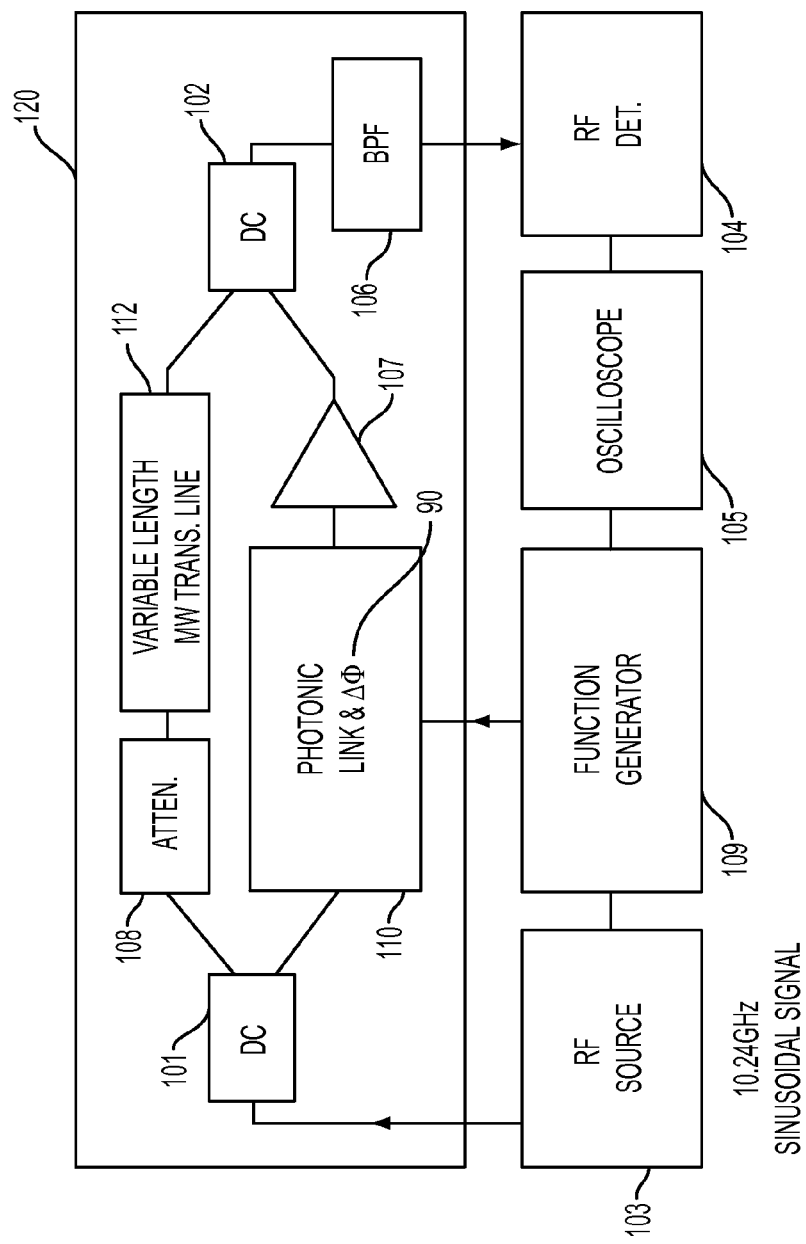
FIG. 11 shows a test set up for testing the tuning speed of the system of FIG. 9.

The tuning speed of the BSG delay line 90 is tested by incorporating it into a photonic link, and placing the photonic link within one arm of a balanced microwave Mach-Zehnder (MZ) interferometer 120, as shown in FIG. 11. A power amplifier 107 amplifies the output of the photonic link with the delay line. An attenuator 108 is included in the other arm of the Mach-Zehnder interferometer to match the power of the arm having the photonic link. Directional coupler 101 split the microwave signal into the two arms of the Mach Zehnder interferometer, and directional coupler 102 couples the output of the two arms. The microwave/RF source 103, for example, a continuous-wave, 10.24 GHz signal, is applied to the interferometer. A narrow band (approximately 1 MHz centered at 10.24 GHz) band pass filter 106 is arranged at the output of the directional coupler 102 to filter noise from the microwave output.

A variable-length microwave transmission line 112 is optionally included in one arm of the microwave interferometer to modify the interference signal. Preferably, the variable-length microwave transmission line is included in the non-photonic arm, although it could suitably instead be included in the photonic arm. The transmission line can be two metal tubes which slide over each other to adjust the total length, with adjustment range of a few centimeters, although other configurations can also be suitable. Such a variable-length microwave transmission line allows an operator to adjust the "bias" of the interferometer (i.e. whether the output of the second directional coupler corresponds to constructive interference, destructive interference, or somewhere in between, for a given value of the invention's time delay). For example, the bias can be set so that at a median value of Vt the interferometer was half way between constructive and destructive, so the interference plots are approximately symmetric.

A function generator 99 applies a signal to the photonic link 110, with the signal being a saw tooth, square wave, or similar. The microwave output power from the interferometer is measured as a function of $V_T$ using a Schottky diode detector 104 and oscilloscope 105.

Figure 12:
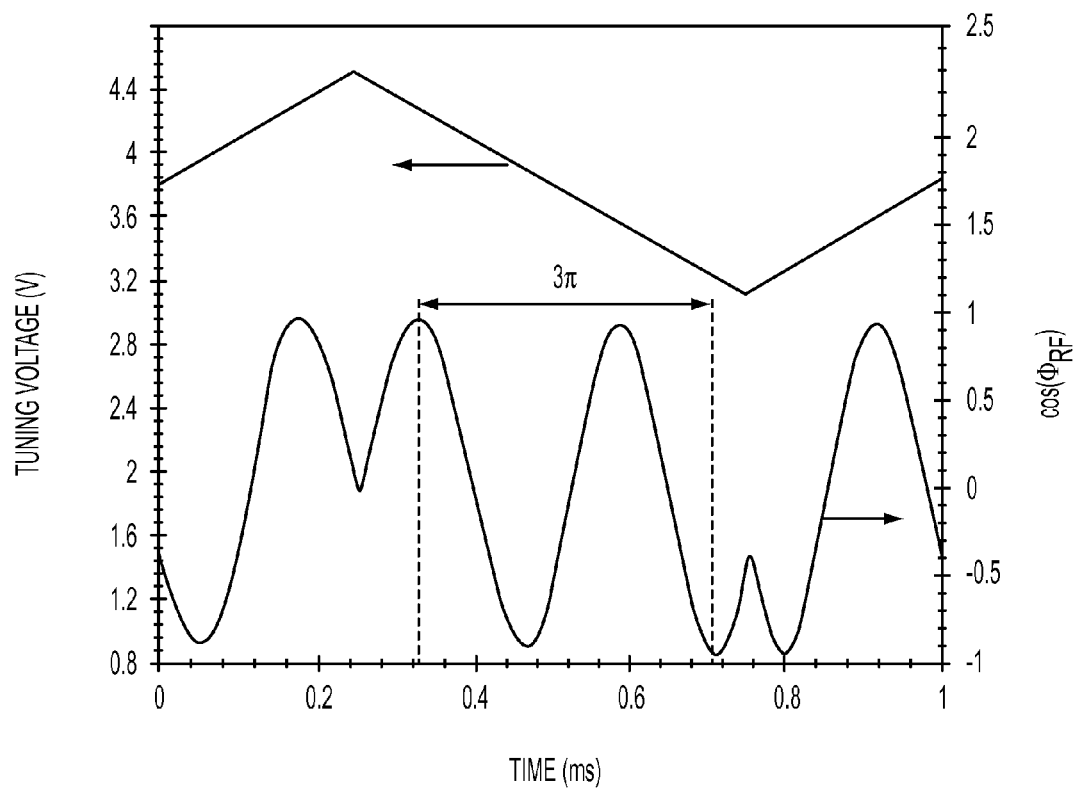
FIG. 12 shows the measured interference signal for a 1 kHz saw-tooth tuning voltage input with continuous-wave, 10.24 GHz signal applied to the interferometer.
Figure 13A:
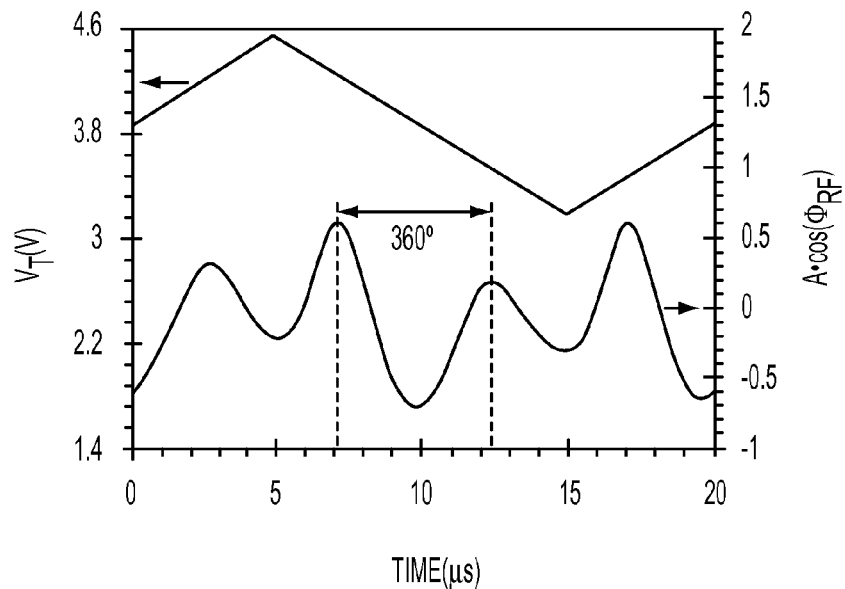
FIGS. 13A and 13B plot the measured interference signal for a 1 kHz saw-tooth tuning voltage input with continuous-wave, 10.24 GHz signal applied to the interferometer.
Figure 13B:
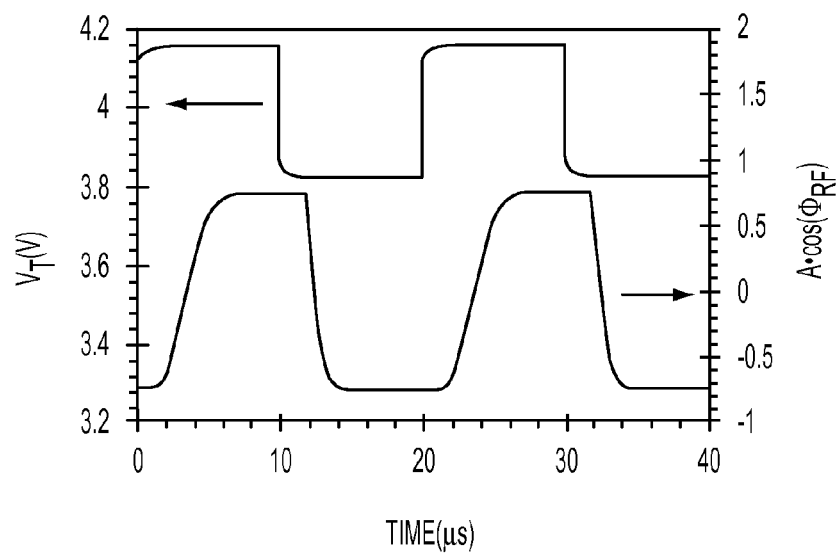

FIG. 12 plots the measured interference signal for a 1 kHz saw-tooth tuning voltage input, determined from the relation $$A \cos \Phi_{RF} = (P_{tot} - P_1 - P_2)/(2\sqrt{P_1 P_2}) \quad (15)$$

in which $P_1$ and $P_2$ are the microwave powers in each arm of the interferometer, $P_{tot}$ is the output power. The term A accounts for residual amplitude modulation in the delay line, and is ideally equal to one. FIG. 12 shows an ideal interference signal, with RF phase tuned continuously over a range of approximately 1.5 microwave periods within the span of 0.5 microseconds. FIG. 13A plots the response for a 50 kHz tuning voltage waveform, which demonstrates continuous tuning over 1.0 microwave periods within 7 microseconds. FIG. 13B plots the measured interference signal for a 50 kHz square wave tuning voltage input. This figure demonstrates that the microwave signal is discretely switchable, with rise and fall times of 1.8 microseconds and 2.1 microseconds, respectively.

Thus, the system 90 provides a delay line capable of near-MHz switching of continuously-tunable, optical-domain RF TTD. The rapid tuning speed thus offers advantages for high-performance, agile photonic systems.

Using a focusing mirror 96 as shown in FIG. 9 rather than the lens 15 shown in FIG. 1 can reduce the device length and make the device more compact. Including one or more planar reflectors in the optical path can reduce the overall length even further. For example, it is believed that a true time delay capable of producing a 1 nanosecond time delay for a whole RF period at 1 GHz can be configured in a space of about one to two square feet, even with a focusing mirror having a focal length of about one meter. In addition, the use of a focusing mirror 86 eliminates chromatic aberrations that could be introduced by a lens, such as the lens 15 in FIG. 1. This can be advantageous when using multiple or variable optical wavelengths. In addition, spherical aberration can be reduced.

Using an acousto-optic or electro-optic beam deflector provides several advantages. First, the system is a rapidly configurable true-time delay. Currently available acousto-optic beam deflectors can switch beam deflection angle, and thus the true time delay, in less than 10 microseconds. Currently available electro-optic beam deflectors can switch the true time delay in less than 100 picoseconds. In comparison, current alternatives are limited to switching times on the order of 1 millisecond.

In addition, EO and AO beam deflectors can continuously scan the beam deflection angle, and thus the true-time-delay. The scanning rate for EO and AO is limited by the control electronics. For AO deflectors, current control electronics limit the scanning frequency to about one MHz. In comparison, current alternatives are believed to have scanning rates below 10 kHz.

The true time delay systems that incorporate an AO or EO beam deflector have a linear relationship between the control voltage and time delay. Adjusting the control voltage provides a proportional change in time delay, which greatly simplifies use of the device. In addition, the linear relationship between the control voltage and the time delay allows the time delay to be controlled to the precision of the applied voltage, resulting in greatly improved delay resolution.

Acousto-optic beam deflectors do not demonstrate significant hysteresis (a response that differs for rising vs. falling control voltage). In comparison, many current delay line alternatives demonstrate hysteresis. For example, piezoelectric fiber stretchers have hysteresis originating from their piezoelectric actuators, motorized stages exhibit backlash, and temperature-tuned devices exhibit hysteresis on time scales less than their thermal time content.

The system in FIG. 9 is described as having an acousto-optic beam deflector, however, other beam deflectors can also be used, including but not limited to, rotating mirrors and electro-optic (EO) beam deflectors.

The use of AO or EO beam deflectors in a time delay system 10 or 90 also allows the beam to be controlled in a pattern that is more complex than a simple back-and-forth oscillatory motion. For example, by changing the control voltage, the beam can be steered to a desired direction to create a desired amount of phase or time delay, and further deflection can be paused to allow the beam to remain in that direction for a period of time.

Beam steered diffractive grating systems can also be configured differently than shown specifically in FIGS. 1, 7, and 9. For example, the grating can be placed above the beam deflector, rather than next to the deflector as in FIG. 9, in order to reduce optical aberration.

As another example, the optical fiber circulator can be eliminated, and separate input and output optical fibers can be used. In such a system, the diffraction grating can be offset slightly from the Littrow angle so the reflected optical energy is transmitted into an output optical fiber located adjacent to the input optical fiber. As another example, the system can be implemented using optical beams not carried on optical fibers, in a free-space implementation.

Figure 14A:
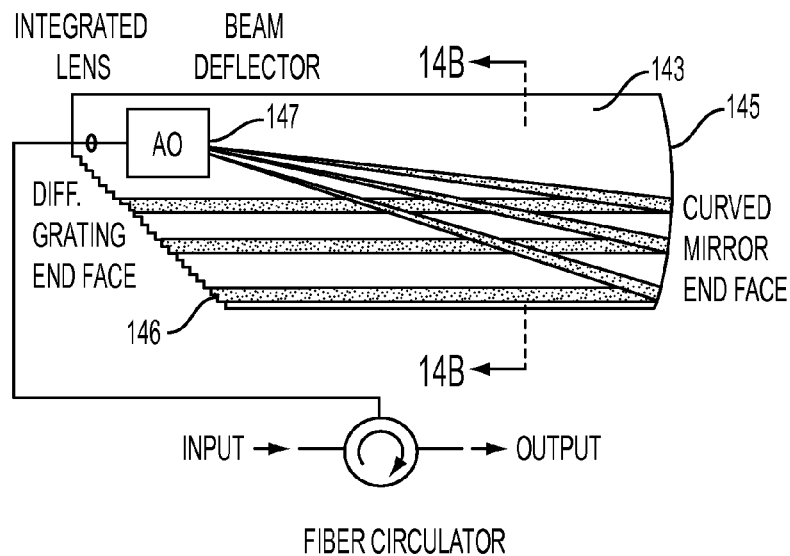
FIGS. 14A and 14B illustrate a waveguide implementation of a time delay system in accordance with an embodiment of the invention.
Figure 14B:
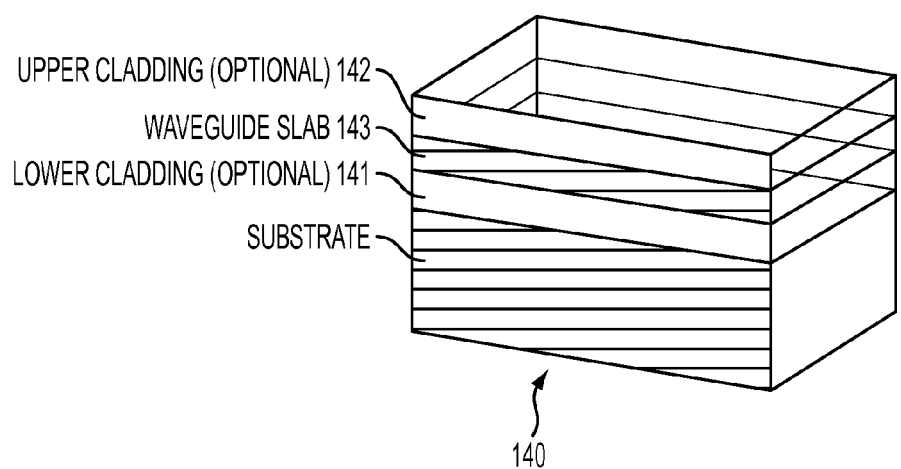

As another example, the system can be implemented within a laser cavity, or could form the laser cavity, with a gain medium positioned in the optical path between the beam deflector and the diffractive grating. A laser can be formed with the gain medium occurring within an amplifying fiber and the beam steered diffractive grating system 10 or 90 at one end of the amplifying fiber. It can also be suitable to fabricate the entire system from a single piece of material. For example, the system could include a planar optical slab waveguide 140 that includes upper and lower claddings 141 and 142 formed of silicon dioxide, and a silicon waveguide 143 layered between the cladding layers, all disposed on a substrate 144, as shown in FIG. 14B. The waveguide 143, is shaped as shown in FIG. 14A, with a mirror face 145 and diffraction grating 146 fabricated on either the edge of the chip or on the surface, using microelectrical fabrication methods. An acousto-optic beam deflector 147 can be integrated in the waveguide, as shown in FIG. 14A, or be arranged externally to the waveguide.

As another example, multiple gratings can be included in the system to increase the delay tuning range and/or to reduce the device length.

Figure 15:
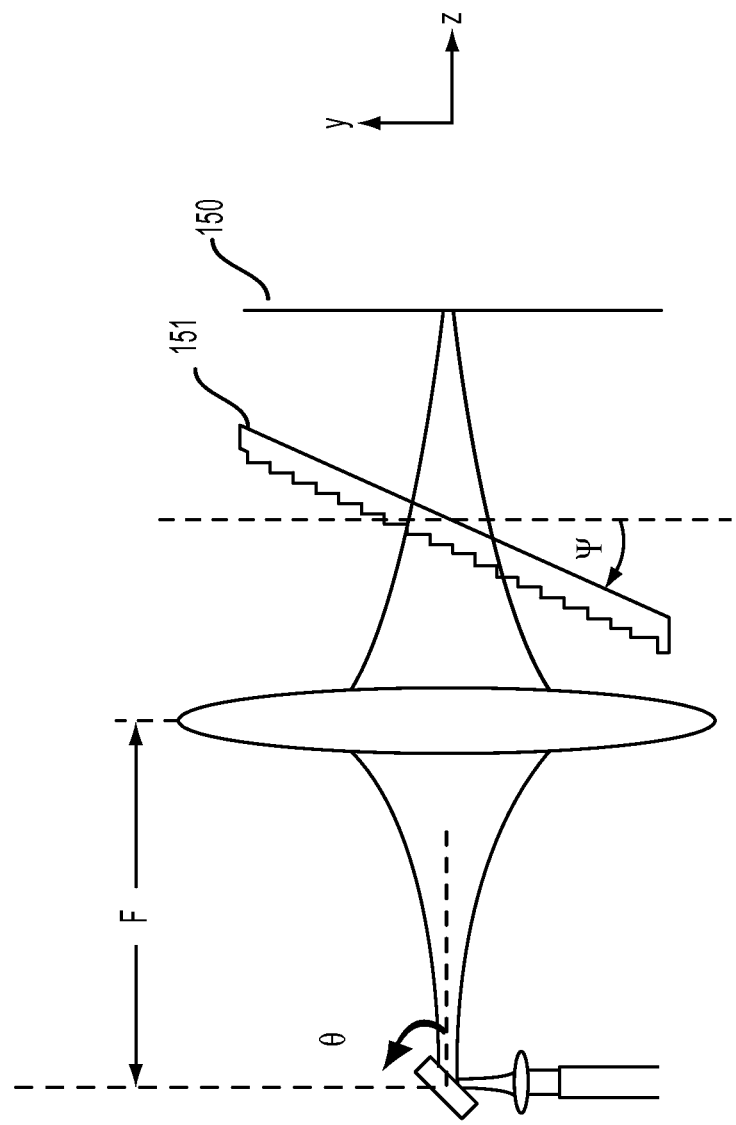
FIG. 15 illustrates a time delay system in accordance with another embodiment of the invention.

As shown in FIG. 15, in another example, the reflective diffractive grating in of FIG. 9 can be replaced with a transmissive diffractive grating 151, and a mirror 150 follows the grating (on the far side of the grating opposite the beam deflector) to reflect the beam back along its original path.

As another example, it can be suitable to use a reflective grating that is polarization independent, and/or a polarization-independent beam deflector.

The examples described herein use a diffractive grating arranged in a Littrow configuration. It can also be suitable to align the diffractive grating so a higher diffractive order is directed toward the beam deflector, however, larger losses would be expected. The invention has been described with reference to certain preferred embodiments. It will be understood, however, that the invention is not limited to the preferred embodiments discussed above, and that modification and variations are possible within the scope of the appended claims.

What is claimed as new and desired to be protected by Letters Patent of the United States is:

1. A time delay device for introducing a time delay into an optical beam, the optical beam being an optical carrier wave modulated with a lower frequency signal, the device comprising:
   an acousto-optic beam deflector adapted to control the beam deflection angle responsive to an applied tuning voltage;
   a lens positioned to image the optical beam onto the beam deflector such that the beam waist of the optical beam is located at the beam deflector;
   a stationary diffractive grating arranged in an optical path with the beam deflector; and
   a focusing element arranged between the beam deflector and the stationary diffractive grating,
   wherein in operation, the beam deflector directs the optical beam across a clear aperture of the focusing element, and the focusing element transmits the beam to the stationary diffractive grating,
   wherein a change in optical path length experienced by the optical beam as the beam moves across the grating surface results in a relative phase delay in the optical beam.

2. The time delay device in accordance with claim 1, wherein the stationary diffractive grating is aligned in Littrow configuration with respect to said focusing element.

3. The time delay device in accordance with claim 1, wherein the stationary diffractive grating is a reflective diffractive grating, and wherein in operation, the stationary diffractive grating reflects the optical beam into a return optical path through the focusing optical element and the beam deflector.

4. The time delay system according to claim 1, wherein the stationary diffractive grating is a transmissive diffractive grating, and the system further comprises a mirror disposed on an opposite side of the diffractive grating, arranged to reflect the optical beam in a return optical path through the diffractive grating, the focusing optical element, and the beam deflector.

5. The system according to claim 1, wherein the lower frequency signal is a microwave signal.

6. The system according to claim 1, wherein the lower frequency signal has a center frequency between one gigahertz and ten terahertz.

7. The system according to claim 1, further comprising:
   a half wave plate arranged in the optical path between the acousto-optic beam deflector and the reflective diffractive grating.

8. The system according to claim 1, wherein the focusing element is a lens.

9. The system according to claim 1, wherein the focusing element is a focusing mirror.

10. The system according to claim 9, wherein the focusing mirror has a spherical surface or parabolic surface.

11. The system according to claim 1, wherein the optical beam is carried on an optical fiber.

12. The system according to claim 1, wherein the optical beam is carried on a single mode optical fiber.

13. The system according to claim 1, further comprising:
   a fiber optic circulator configured to separate the input optical beam and a delayed output optical beam.

14. A method for delaying an optical beam, the optical beam being an optical carrier modulated with a lower frequency signal, the method comprising:
   transmitting the optical beam, the optical beam being an optical carrier wave modulated with a lower frequency signal;
   imaging the optical beam onto a beam deflector with a lens positioned such that the beam waist of the optical beam is located at the beam deflector;
   deflecting the optical beam, by the beam deflector, such that the optical beam is swept across the surface of a focusing optical element; and
   the focusing optical element transmitting the swept deflected optical beam to a stationary diffractive grating configured in a Littrow configuration;
   wherein a change in optical path length experienced by the optical beam as the beam is scanned across the grating surface results in a relative phase delay in the optical beam.

15. The method in accordance with claim 14, wherein the stationary diffractive grating is aligned in Littrow configuration with respect to said focusing element.

16. The method in accordance with claim 14, wherein the stationary diffractive grating is a reflective diffractive grating, said method further comprising:
   reflecting, by the stationary diffractive grating, the optical beam into a return optical path through the focusing optical element and the beam deflector.

17. The method according to claim 14, wherein the stationary diffractive grating is a transmissive diffractive grating, and the method further comprising: reflecting, by a mirror disposed on an opposite side of the diffractive grating, the optical beam in a return optical path through the diffractive grating, the focusing optical element, and the beam deflector.

18. The method according to claim 14, wherein the lower frequency signal is a microwave signal.

19. The method according to claim 14, wherein the lower frequency signal has a center frequency between one gigahertz and ten terahertz.

20. The method according to claim 14, wherein the beam deflector is rotatable mirror.

21. The method according to claim 14, wherein the beam deflector is an acousto-optic beam deflector adapted to control the beam deflection angle responsive to an applied tuning voltage.

22. The method according to claim 21, further comprising:
   deflecting, by the acoust-optic beam deflector, the optical beam through a half wave plate arranged in the optical path between the acousto-optic beam deflector and the reflective diffractive grating.

23. The method according to claim 14, wherein the focusing optical element is a lens.

24. The method according to claim 14, wherein the focusing optical element is a focusing mirror.

25. The method according to claim 14, wherein the focusing mirror has a spherical surface or parabolic surface.

26. The method according to claim 14, wherein said transmitting the optical beam comprises emitting the optical beam from an end of an optical fiber.

27. The method according to claim 14, wherein said transmitting the optical beam comprises emitting the optical beam from an end of an optical fiber.

28. The method according to claim 14, further comprising:
   separating, with a fiber optic circulator, an input optical beam and a delayed output optical beam.

* * * * *